United States Patent
Duan et al.

(10) Patent No.: US 11,837,561 B2
(45) Date of Patent: Dec. 5, 2023

(54) CHANNELIZED FILTER USING SEMICONDUCTOR FABRICATION

(71) Applicant: Northrop Grumman Systems Corporation, Falls Church, VA (US)

(72) Inventors: Dah-Weih Duan, Redondo Beach, CA (US); Elizabeth T. Kunkee, Redondo Beach, CA (US); Stephane Larouche, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 18/123,467

(22) Filed: Mar. 20, 2023

(65) Prior Publication Data
US 2023/0230942 A1 Jul. 20, 2023

Related U.S. Application Data

(63) Continuation of application No. 17/745,265, filed on May 16, 2022, now Pat. No. 11,658,136, which is a
(Continued)

(51) Int. Cl.
*H01L 23/66* (2006.01)
*H01P 1/203* (2006.01)

(52) U.S. Cl.
CPC .......... *H01L 23/66* (2013.01); *H01P 1/20327* (2013.01); *H01L 2223/6627* (2013.01); *H01L 2223/6655* (2013.01)

(58) Field of Classification Search
CPC ....... H01L 25/072; H01L 23/50; H01L 24/48; H01L 24/49; H01L 2224/49111;
(Continued)

(56) References Cited

U.S. PATENT DOCUMENTS

| 6,128,195 A | 10/2000 | Weber et al. |
| 2010/0148293 A1 | 6/2010 | Jain et al. |
| 2016/0030965 A1 | 4/2016 | Lin |

*Primary Examiner* — Elias Ullah
(74) *Attorney, Agent, or Firm* — MCCRACKEN & GILLEN LLC

(57) ABSTRACT

A semiconductor technology implemented high-frequency channelized filter includes a dielectric substrate with metal traces disposed on one of two major surfaces of the substrate. An input and output port disposed on the substrate and one of the metal traces carrying a high-frequency signal to be filtered between the input and output port. Other of the metal traces are connected to the one metal trace at intervals along the length of the one metal trace each providing a reactance to the high-frequency signal where the reactance varies with frequency and additional traces of the metal traces serving as a reference ground for the one metal trace and the other metal traces. A silicon enclosure mounted to the substrate with a first planar surface with cavities in the enclosure that extend through the first surface, and internal walls within the silicon enclosure defining the cavities. A layer of conductive metal covers the first planar surface, cavities and the internal walls. The silicon enclosure having substantially continuous areas of metal on the first planar surface about the periphery of the silicon enclosure that engage corresponding areas of the additional traces about the periphery of the substrate. The cavities surround the respective other metal traces with the internal cavity walls engaging the additional traces adjacent the respective other metal traces to individually surround each of the other metal traces with a conductive metal thereby providing electromagnetic field isolation between each of the other metal traces.

17 Claims, 3 Drawing Sheets

Related U.S. Application Data continuation of application No. 16/916,644, filed on Jul. 17, 2020, now Pat. No. 11,373,965.

(58) Field of Classification Search
CPC ........... H01L 2224/49175; H01L 23/04; H01L 23/5386; H01L 25/162; H01L 2224/48227; H01L 23/49838; H01L 23/49844

See application file for complete search history.

CHANNELIZED FILTER USING SEMICONDUCTOR FABRICATION

CROSS REFERENCE TO RELATED APPLICATIONS

The present application is a continuation application of U.S. patent application Ser. No. 17/745,265 filed May 16, 2022 which was a continuation application of U.S. patent application Ser. No. 16/916,644, filed Jul. 17, 2020 (now U.S. Pat. No. 11,373,965, issued Jun. 28, 2022), entitled "CHANNELIZED FILTER USING SEMICONDUCTOR FABRICATION", the entire contents of which are incorporated herein by reference.

BACKGROUND

Embodiments of the invention relate to channelized microstrip filters made using semiconductor fabrication technology with an enclosure composed of micromachined interiors that enhance the performance of the microstrip filters and provide manufacturability that yields repeatable performance results.

High-frequency, i.e. frequencies of 1 GHz and higher, microstrip filters have been constructed using a variety of materials and techniques. It is preferable to test subassemblies prior to being installed in a larger circuit assembly so that the assembly is built of known good devices. However, the ability to test a high-frequency modular microstrip filter to confirm that it has acceptable performance prior to installation in the larger assembly has proven to be a substantial challenge, in part because the filter performance is sensitive to the housing in which it is assembled. If it is discovered that the modular microstrip filter does not meet performance specifications after being installed as part of the larger assembly, the modular microstrip filter may require a tedious in-place tuning process or may require removal and replacement with another modular microstrip in order to yield acceptable filter performance in the larger assembly.

In order to provide electromagnetic isolation an RF filter, a housing, such as of sheet metal, machined metal, or a casted metal, may be used to enclose the microstrip filter. However, variations in the physical dimensions of the metal housing often results in undesired variations in electromagnetic coupling within the filter elements and leads to variations in the performance of the filter.

There is a desire to minimize the area occupied by high-frequency filters as part of an overall desire towards miniaturization of electronic circuits. Reducing the overall area of the filter requires that individual internal elements of the filter be increasingly closer together. This increases the likelihood of electromagnetic field interaction between the elements which leads to increased challenges in being able to account for such interactions during the design of the filter and provides an undesired variable that adversely impacts reproducible performance from unit to unit.

There exists a need for an improved high-frequency microstrip filter that minimizes these difficulties.

SUMMARY

It is an object of embodiments of the present invention to provide improved modular microstrip filters that minimize such difficulties.

A semiconductor technology implemented high-frequency channelized filter includes a dielectric substrate with metal traces disposed on one of two major surfaces of the substrate. An input and output port disposed on the substrate and one of the metal traces carrying a high-frequency signal to be filtered between the input and output port. Other of the metal traces are connected to the one metal trace at intervals along the length of the one metal trace each providing a reactance to the high-frequency signal where the reactance varies with frequency and additional traces of the metal traces serving as a reference ground for the one metal trace and the other metal traces. A silicon enclosure mounted to the substrate with a first planar surface with cavities in the enclosure that extend through the first surface, and internal walls within the silicon enclosure defining the cavities. A layer of conductive metal covers the first planar surface, cavities and the internal walls. The silicon enclosure having substantially continuous areas of metal on the first planar surface about the periphery of the silicon enclosure that engage corresponding areas of the additional traces about the periphery of the substrate. The cavities surround the respective other metal traces with the internal cavity walls engaging the additional traces adjacent the respective other metal traces to individually surround each of the other metal traces with a conductive metal thereby providing electromagnetic field isolation between each of the other metal traces. Conductive engagement is formed between the first planar surfaces and the additional traces to establish a common reference ground therebetween.

A high-frequency filter having a substantially planar dielectric substrate and metal traces that are lithographically fabricated on one of two major surfaces of the substrate is also provided in which an input and output port are disposed on the substrate. One of the metal traces carrying a high-frequency signal is to be filtered between the input and output port. Other of the metal traces, connected to the one metal trace at intervals along the length of the one metal trace, each providing a reactance to the high-frequency signal where the reactance varies with frequency. Additional traces of the metal traces serve as a reference ground for the one metal trace and the other metal traces. A micro-machined silicon enclosure is mounted to the substrate with a first planar surface with cavities in the enclosure that extend through the first surface, and internal walls within the silicon enclosure define the cavities. A layer of conductive metal covers the first planar surface, cavities and internal walls. The silicon enclosure has substantially continuous areas of metal on the first planar surface about the periphery of the silicon enclosure that engage corresponding areas of the additional traces about the periphery of the substrate. Each cavity surround at least one of the other metal traces with the internal cavity walls engaging the additional traces adjacent the respective other metal traces to individually surround the at least one of the other metal traces with a conductive metal thereby providing electromagnetic field isolation between cavities. Conductive engagement is formed between the first planar surfaces and the additional traces to establish a common reference ground therebetween.

DESCRIPTION OF THE DRAWINGS

Features of exemplary embodiments of the invention will become apparent from the description, the claims, and the accompanying drawings in which:

DETAILED DESCRIPTION

One aspect of the present invention resides in the recognition of the difficulties associated with repeatably manufacturing high-frequency channelized filters with consistent performance that does not require post-manufacture tuning by minimizing cross-coupling of electromagnetic fields between filter elements. Effective element shielding is important to minimize such cross-coupling, especially between adjacent elements, in order to minimize undesired unit to unit performance variations. Effective element shielding also allows filter elements to be compacted by using meandering filter elements to minimize the total area footprint of the filter.

Another aspect of the present invention resides in the recognition of an improvement in input/output coupling that facilitates the ability to reliably test the performance of a high-frequency modular filter prior to installation of the filter in a larger electronic assembly. In one embodiment, testing from ports on the bottom surface of the substrate opposite to that containing the filter elements provides ease of access for test probes and for connection in a larger circuit assembly.

Figure 1:
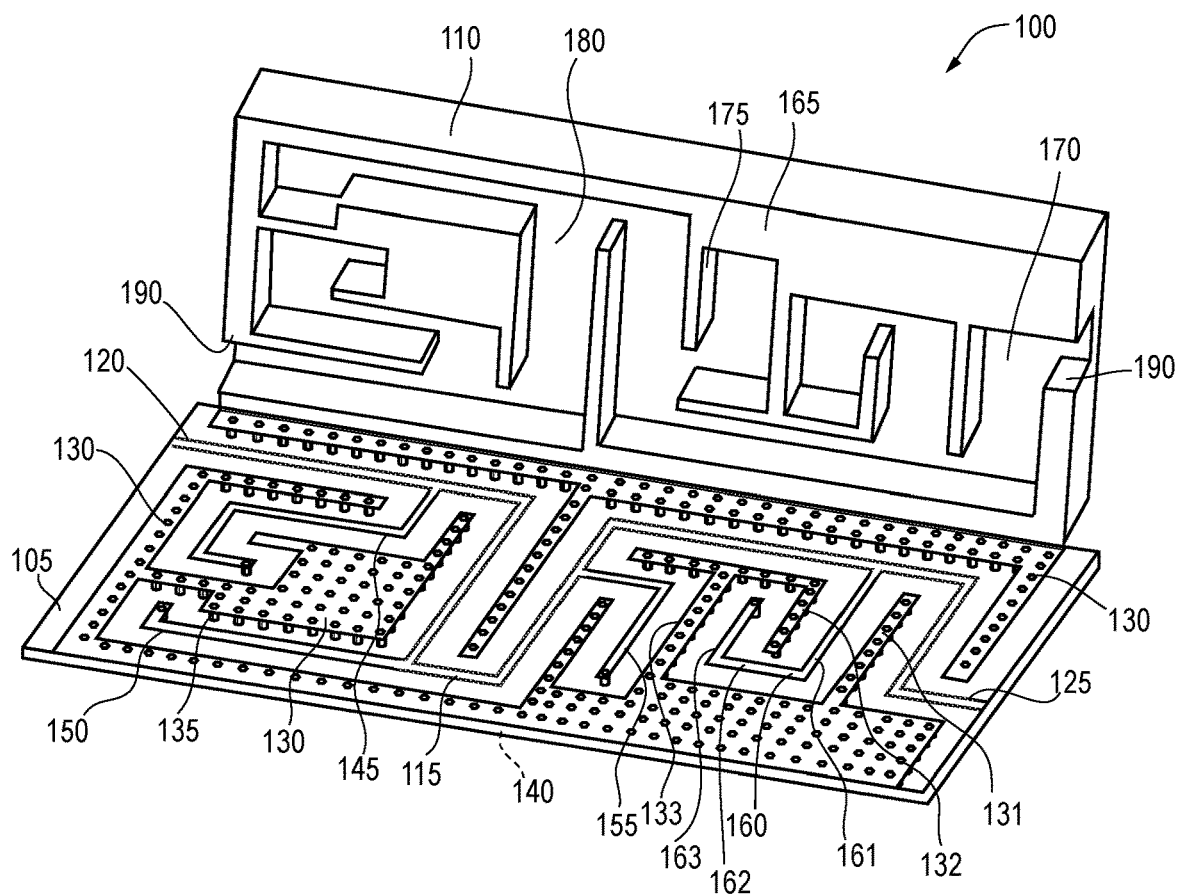
FIG. 1 shows a perspective view of a high-frequency channelized filter in accordance with an embodiment of the present invention with an enclosure in an open position.

FIG. 1 shows a perspective view of a high-frequency channelized filter 100, e.g. a microstrip filter, in accordance with an embodiment of the present invention with a substrate 105 and an enclosure 110 in an open position. The term "channelized" is used herein to refer to the use of conductive channels that separate individual elements of the filter as opposed to a single enclosure space that covers multiple elements or an entire filter/circuit. A primary signal conductor (transmission line) 115 is disposed on the top side of substrate 105, which is preferably made of a low-loss dielectric such as silicon carbide, alumina, InP, GaAs, quartz, and extends between input and output ports, 120, 125. A reference conductor 130, which acts as ground, extends across various regions on the top of substrate 105 and is interconnected by a plurality of vias 135 to a reference conductor/ground 140 located across substantially the entire bottom side of substrate 105. A plurality of individual filter elements 145, 150, 155, and 160 are selected to provide frequency varying values of inductance and/or capacitance to the respective points of connection to the primary signal conductor 115. The combined effect of the selected inductance and capacitance values of the filter elements as disposed at locations along the signal line define the passband and rejection characteristics of the illustrative bandpass microstrip filter.

The enclosure 110, when in the closed position, substantially surrounds the top peripheral surface of the substrate 105. Enclosure 110 is preferably made of silicon with a planar surface 165 disposed to engage the top surface of substrate 105. The enclosure 110 contains a plurality of cavities 170, preferably formed by deep reactive ion etching (DRIE) for micro-precision dimensions. The silicon micromachining enables tightly controlled geometries of the electromagnetic cavities 170 of the channelized microstrip filter. The cavities 170 correspond to those areas on the top surface of substrate 105 that will help individually encapsulate the filter elements and the signal line. The surface portions of planar surface 165 are conductive, i.e. preferably plated with a good conductor such as gold, and are disposed to engage the reference/ground areas 130. The vertical sidewalls 175 and the bottom 180 of the cavities formed in the cover are also conductive, i.e. also preferably plated with a good conductor such as gold. Thus, when the enclosure 110 is placed in the assembled position to engage the top surface of substrate 105, all surfaces of the enclosure facing the substrate are continuously conductive and connected to the ground 130. The ends of the interior walls formed by the etched cavities 170 of the enclosure 110 correspond to and are disposed to engage corresponding ground areas 130, including those ground areas interior of the periphery that separate the individual filter elements. Therefore, each of the individual filter elements are enclosed above the substrate within a separate volume/chamber that is grounded which provides isolation and basically eliminates undesired cross-coupling between filter elements. Cut-out portions 190 in the end walls of the enclosure 110 provide an opening for access to the input 120 and output 125 signal lines. This facilitates not only connection of the input and output signal line of the channelized microstrip filter to a larger circuit assembly but also allows for the temporary engagement of probes to test the filter prior to installation in the larger circuit assembly.

Figure 2:
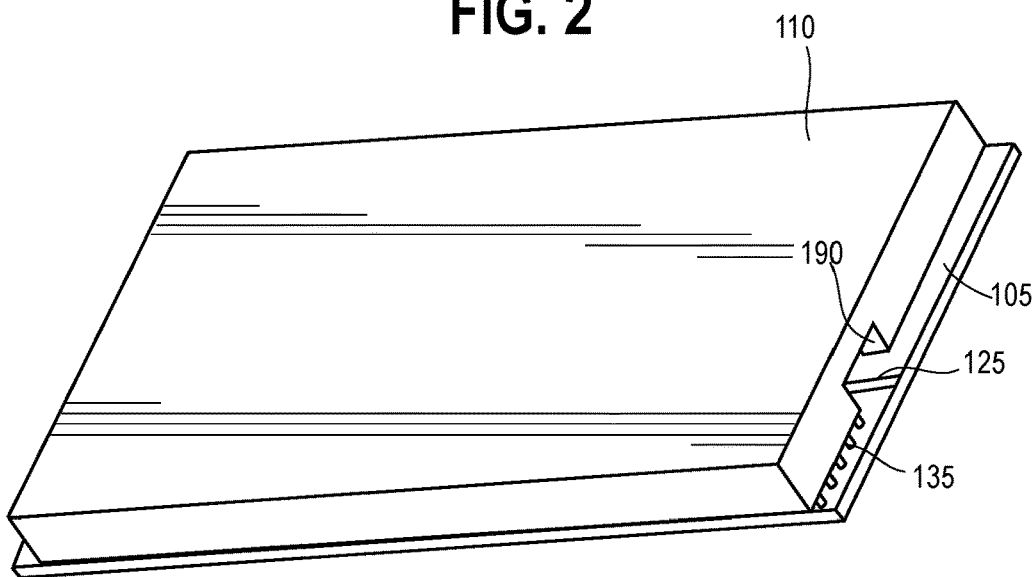
FIG. 2 shows a perspective view of the channelized filter as shown in FIG. 1 with the enclosure in final assembled position.

FIG. 2 shows a perspective view of the channelized filter 100 with the enclosure 110 in a final assembled position engaging the substrate 105 to provide a continuous peripheral ground connection with the ground 130 of the substrate except for the cut-out portions 190. Also, each of the interior walls defined by the etched areas 170 in the enclosure 110 engage corresponding ground areas 130 on the substrate 105. As will be seen by referring to FIG. 1, each of the elements 145, 150, 155, 160 will be totally surrounded on and above the top of the substrate 105 by a metallic ground surface with only portions of each of the elements that form a connection with the signal line 115 extending outside of the individual metallic enclosures. Because the ground 140 extends substantially over the entire bottom side of the substrate 105 and is connected by the plurality of vias 135 distributed throughout the ground area to the ground on the top side of the substrate 105, each of the filter elements is also surrounded on the bottom of the substrate 105 by a metallic ground. The degree of encapsulation of the filter elements provides a very effective electromagnetic shield that minimizes cross coupling between elements as well as preventing coupling to circuitry outside of the channelized microstrip filter. In order to provide an effective continuous electromagnetic grounding of the metal 130 on the top side of the substrate and the metal 140 on the bottom side of the substrate at the high-frequencies of operation of the channelized microstrip filter, each of the top and bottom metals are connected by a plurality of vias that preferably have a spacing not more than 0.1 wavelengths for the highest frequencies of operation. Preferably, the conductive layers on surface 165 of enclosure 110 that engage conductive metal 130 on substrate 105 are coupled together using gold-to-gold thermocompression bonding for micron precision assembly.

Exemplary circuit elements are implemented by the traces 145, 150, 155 and 160 as shown in FIG. 1. However, those skilled in the art will understand that these filter elements are merely exemplary of various types and numbers of filter elements and layouts, and that other filter configurations and layouts can be used to provide desired frequency selectivity using the techniques of the embodiments of this invention. For example, the conductor 115 in a different filter topology may not be continuous or a DC short-circuit between the input and the output; it could be made non-continuous by an element such as "pi-of-cap" that introduces gaps consisting of three capacitors in tandem—a shunt capacitor, a series capacitor, and a second shunt capacitor. Similarly, the short-circuited shunt stubs could be open-circuited shunt stubs, coupled-line stub, or even higher order sub-circuit such as inductive segment followed by a capacitive segment.

In order to minimize the footprint area occupied by the filter, the individual filter elements meander over the length of the filter elements. The signal line 115, metallic ground traces 130 on the top surface of the substrate, and the filter elements reside in a common plane parallel to the plane of the substrate. The filter elements meander within this plane. As used herein, "meander" means to turn at one or more angles, preferably at 45 degrees or more within the same plane. Using 90 degrees as an example, filter element 160 consists of a first segment 161 that is connected to the signal line 115, a second segment 162 coupled to the end of segment 161 and being perpendicular to segment 161, and segment 163 coupled to the end of segment 162 and being perpendicular to segment 162 and parallel to segment 161. In comparison, a conventional filter element would typically extend in a straight line which would require a substantially wider and/or longer substrate than the substrate 105 and cause the associated substrate of the filter to have a substantially larger footprint area. A meandering approach to reduce the filter footprint in a conventional "open-face" filter (without channelized filter elements) brings serious challenges. Such an approach would require substantially increased design effort because the interactive coupling from one filter element to another filter element or the signal line would require repeated electromagnetic simulations and trial-and-error experiments to resolve issues of raised return loss, skewed slope of fall-off, undesired spikes in the stop band rejection etc. And yet the final design outcome of such an approach is sensitive to manufacturing tolerance and the housing channel height and width due to the cross coupling of all elements through an empty space. The ground segments 131, 132 and 133 are spaced apart from the segments of filter element 160 and function to surround the entire meandering length of the filter element. These ground segments in combination with the corresponding engaged walls of the associated cavities provide an effective grounded chamber for the entirety of the meandering filter element 160 except for the small portion of 160 that connects to the signal line 115.

In order to prevent undesired cross coupling of segment 163 of the filter element with segment 161, the ground segment 132 is disposed therebetween which together with the corresponding engaged wall of the associated cavity provides isolation between these two segments. Ground segment 131 also serves to provide isolation between segment 161 of the filter element and a parallel portion of the signal line 115. Ground segment 133 provides isolation between segment 163 of the filter element and adjacent filter element 155 which has a portion parallel to segment 163. Of course, the walls of the associated cavities that engage the ground segments 131 and 133 complete the corresponding chambers that provide isolation.

Figure 3:
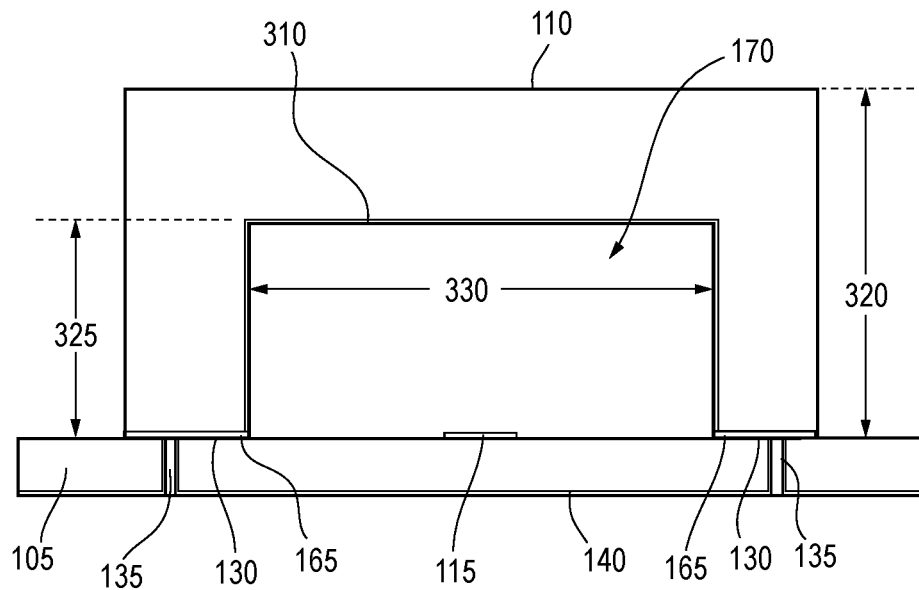
FIG. 3 shows a representative cross-section of the assembled channelized filter in accordance with the embodiment of the present invention.

FIG. 3 shows a representative cross-section of the channelized filter 100 as assembled with the enclosure 110 engaging the substrate 105. A layer of gold plating 310 covers the interior surfaces of enclosure 110 and surfaces 165 that engage the metallic grounds 130 on the top surface of the substrate 105. The enclosure is preferably made of a micromachined silicon wafer on which a layer of metal is deposited having a peak to valley roughness of less than 1 microns. Such smoothness contributes to consistent performance and reduced losses especially at higher frequencies.

Representative vias 135 provide continuity between the top and bottom ground metallization on the substrate. In one example of an embodiment, the overall height 320 of the enclosure 110 is approximately 1 mm, the internal cavity height 325 is approximately 0.635 mm, and the width 330 of the cavity is approximately 0.800 mm. These dimensions coincide with the response of the exemplary filter discussed with regard to FIG. 4.

Figure 4:
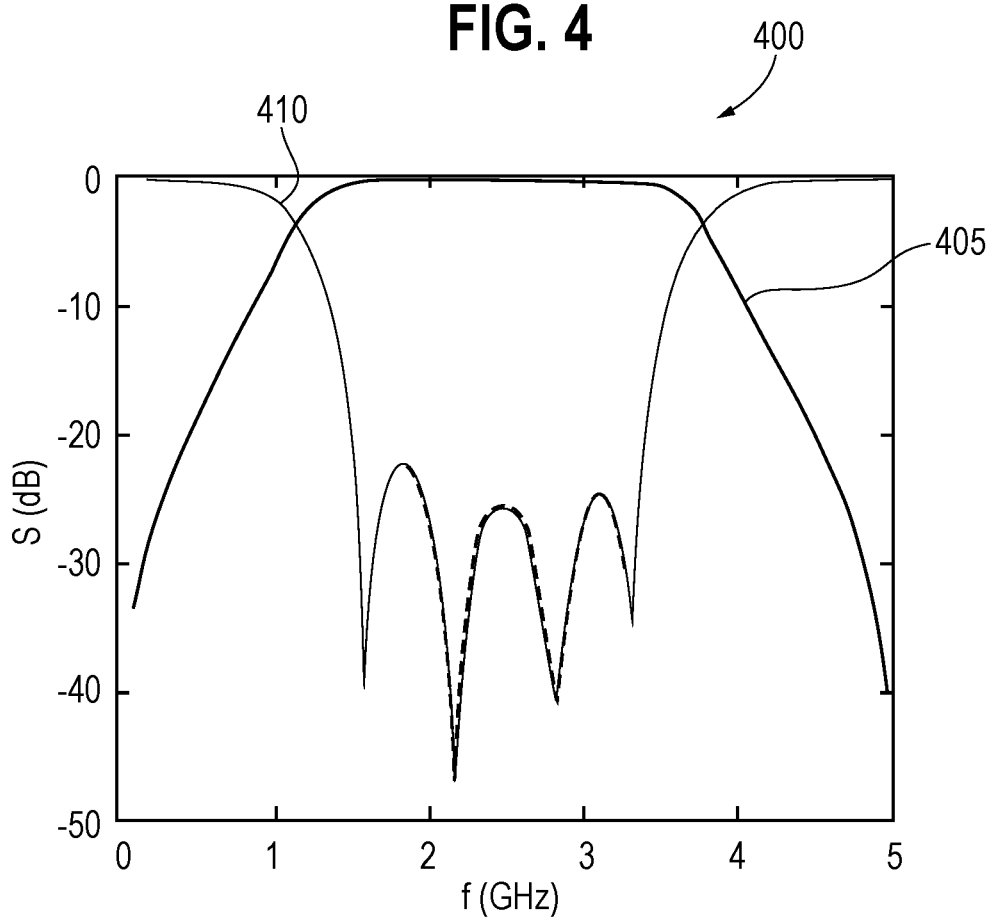
FIG. 4 shows a graph illustrating performance characteristics of the exemplary channelized filter over a frequency range in accordance with an embodiment of the present invention.

FIG. 4 is a graph 400 illustrating performance characteristics of the exemplary channelized filter 100 over a frequency range of 0 GHz to 5 GHz. The vertical axis represents decibels (dB) and the horizontal axis shows frequency in gigahertz. Curve 405 shows the bandpass filter transmission characteristics ($S_{21}$) showing the passband with relatively low signal loss from about 1.5 GHz to 3.5 GHz with increasing signal loss below and above this range. Curve 410 shows the input reflection loss ($S_{11}$) that begins to increase starting about 1 GHz and returns to relatively low values about 4 GHz. Input reflection loss within the bandpass filter range is a minimum of 20 dB. These filter characteristics for the exemplary channelized microstrip filter 100 with compressed/folded/meandering filter elements compare favorably to the characteristics for a conventional microstrip filter that occupies a substantially larger area than filter 100 and uses straight line filter elements.

Figure 5:
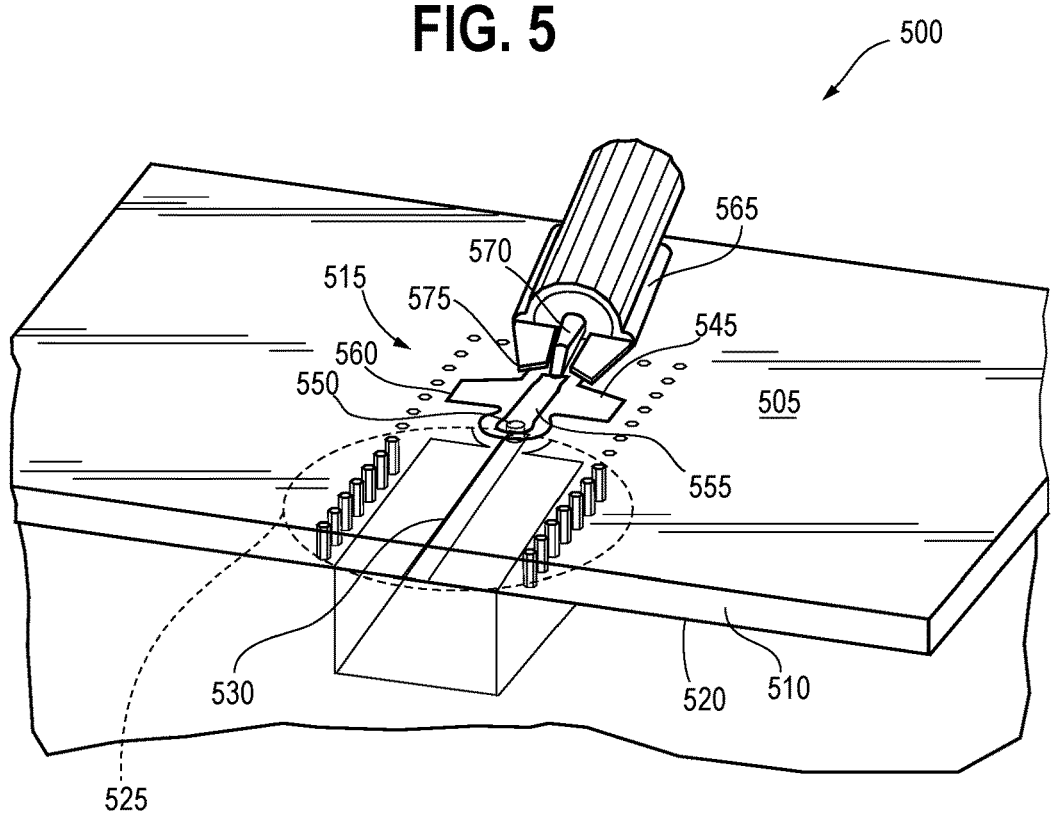
FIG. 5 is a partial perspective view of an alternative embodiment of a channelized filter of the present invention that shows the ability to test the performance of the filter from the bottom surface of the planar substrate.
Figure 6:
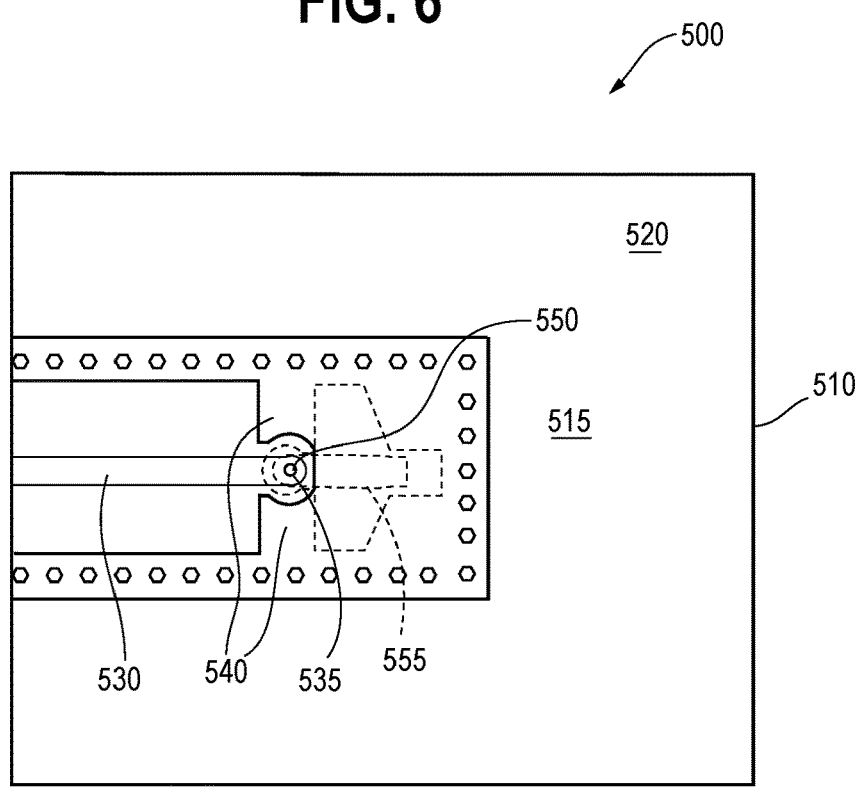
FIG. 6 shows a partial, exploded top view of the embodiment of FIG. 5.

FIGS. 5 and 6 are a partial perspective views of an alternative embodiment 500 of a channelized filter that includes bottom access ports on the bottom surface 505 of the planar substrate 510 that provide the ability to engage probes and test the performance of the filter. Since the differentiating features of filter 500 relative to filter 100 relate to input/output ports accessible from the bottom 505 of the substrate 510 as opposed to access to the input/output ports disposed on the top side of the substrate for filter 100, only one of two exemplary input/output port 515 is shown.

FIG. 5 shows a partial view of the bottom 505 of substrate 510 while FIG. 6 shows a partial view of the top 520 of substrate 510. Referring to FIG. 5, a section 525 of the bottom 505 is shown removed to show the rows of vias connecting the top and bottom surface metallization (ground). The signal line 530 for filter 500 is the same as signal line 115 for filter 100. As seen in FIG. 6, signal line 530 terminates at metallization 535 on the top side 520 of the substrate and is flanked by metallic ground regions 540. This is the structure as provided for the input/output ports for filter 100. As seen in FIG. 5, a region 545 on the bottom 505 of substrate 510 has no metallization. A via 550 connects a strip of metallization 555 on the bottom 505 with metallization 535 disposed on the top surface 520. The via 550 provides a conductive coupling of the signal on the signal line 530 to the metal conductor 555 on the bottom of the substrate. The expanded areas 560 of region 545 without metallization on the bottom of the substrate provide an impedance transformation to provide a 50 ohm impedance for the port 515. As seen in FIG. 5, a probe 565 includes a center signal conductor 570 and a pair of ground terminations 575 shown engaging one of the input and output ports 515 on the bottom of the substrate. The other bottom port (not shown) is identical and provides access to the other of the input and output ports. Ports on the bottom surface of the substrate simplify testing and allow probes (and connection points to other circuitry in the larger assembly) easy access and coupling without requiring a cutout of the enclosure as in filter 100. Thus, the enclosure of filter 500 does not require and does not have a cutout in the end walls. This provides increased shielding as there is no opportunity for electromagnetic fields to enter/exit through the cutout areas and reduces manufacturing complexity of the enclosure. Similarly, there is no opportunity for foreign objects to enter into the filter cavity through the cutouts and cause detrimental effect such as de-tuning and short-circuiting on filter performance. It is understood that the shapes 540 are actually connected to the ground and manufactured as one metallization instead of two separate metallizations. The difference is that Si cover lands on the ground but not on 540.

The concept of a channelized filter is not limited to the exemplary microstrip line where the signal trace runs on top of a ground plane and a top enclosure forms individual chambers around each filter element. It is also applicable to other types of transmission lines such as stripline where the signal trace on a substrate is captivated between a top ground enclosure and a bottom ground enclosure, i.e. where a top channelized enclosure and a mirror image bottom channelized enclosure cooperate to surround and sandwich the individual respective filter elements within individual separate chambers.

Although exemplary implementations of the invention have been depicted and described in detail herein, it will be apparent to those skilled in the art that various modifications, additions, substitutions, and the like can be made without departing from the spirit of the invention. For example, the cavities can be different heights and various bonding techniques including eutectic bonding such as indium-gold or gold-tin, or copper pillar bonding could be used to attach the enclosure to the ground metallization on the substrate. The enclosures of the channelized filters can be bonded to a plurality of corresponding substrates manufactured on a single wafer rather than as separated substrates. The cavity height is only limited by the fabrication capability of the silicon etching tool. A silicon enclosure with two different etch (cavity) depths is possible.

The scope of the invention is defined in the following claims.

We claim:

1. A semiconductor technology implemented cover for a high-frequency circuit disposed on a substantially planar dielectric substrate having lithographically fabricated metal traces disposed on one of two major surfaces of the substrate, an input and output port disposed on the substrate, one of the metal traces carrying a high-frequency signal between the input and output port, a plurality of other of the metal traces connected to the one metal trace at intervals along the length of the one metal trace, the plurality of other metal traces each providing a reactance to the one metal trace where the reactance varies with frequency, additional traces of the metal traces serving as a reference ground for the one metal trace and the other metal traces;

the cover comprising:
 a silicon enclosure dimensioned to be mounted to the substrate with a first planar surface with cavities in the enclosure that extend through the first surface, internal walls within the silicon enclosure defining the cavities;
 a layer of conductive metal covers the first planar surface, cavities and internal walls;
 the silicon enclosure having substantially continuous areas of metal on the first planar surface about the periphery of the silicon enclosure that are dimensioned to engage corresponding areas of the additional traces about the periphery of the substrate;
 the cavities are dimensioned to surround the respective other metal traces with the internal cavity walls disposed to engage the additional traces adjacent the respective other metal traces to individually surround each of the other metal traces with a conductive metal with the cover engaging the dielectric substrate thereby providing electromagnetic field isolation between each of the other metal traces;
 conductive engagement is formed between the first planar surfaces of the enclosure and the additional traces with the cover engaging the dielectric substrate to establish a common reference ground therebetween.

2. The cover of claim 1 further comprising corresponding cavities dimensioned with associated cavity walls that engage additional traces adjacent the one metal trace to substantially surround the one metal trace with a conductive metal between the input and output ports thereby providing electromagnetic field isolation.

3. The cover of claim 1 wherein the substrate is silicon carbide and the layer of conductive metal is gold.

4. The cover of claim 1 further comprising:
 metal deposited on the other major surface of the substrate, and;
 a plurality of closely spaced, contiguous, through-hole conductive vias disposed to connect the additional traces on the one surface of the substrate to the metal deposited on the other major surface of the substrate to define common reference ground.

5. The cover of claim 1 wherein the cavities are formed in a micromachined silicon wafer and the layer of conductive metal having a peak to valley roughness of less than 2 microns.

6. The cover of claim 1 wherein the input and output ports are disposed on the one of the major surfaces of the substrate, and the cover having cutaway sections of a peripheral wall adjacent the input and output ports.

7. The cover of claim 1 wherein at least one of the plurality of other of the metal traces meanders along its length to minimize the area of the substrate required to support the other metal traces.

8. The cover of claim 7 wherein at least 50% of the plurality of other of the metal traces meander along the respective lengths to minimize the area of the substrate required to support the other metal traces.

9. The cover of claim 7 wherein all of the plurality of other of the metal traces meander along the respective lengths to minimize the area of the substrate required to support the other metal traces.

10. The cover of claim 7 wherein the one of the metal traces meanders between the input and output ports.

11. The cover of claim 1 wherein the dielectric substrate includes:
 a first via connecting the one metal trace near one end of the one metal trace on the one of the major surfaces of the substrate to an input metal disposed on the other of the major surface of the substrate, and a second via connecting the one metal trace near the other end of the one metal trace on the one of the major surfaces of the substrate to an output metal disposed on the other of the major surface of the substrate;

the input and output ports connected to the input metal and output metal, respectively, and are disposed on the other of the major surfaces of the substrate, thereby facilitating easy access to the input and output ports for testing performance of the filter prior to installation of the cover in a larger circuit assembly.

12. The cover of claim 11 wherein the cover has a contiguous area of the first planar surface enclosing the entire periphery of the cover that is dimensioned to engage corresponding contiguous areas of the additional traces about the entire periphery of the substrate so that no openings exist between the interior of the enclosure and the exterior.

13. The cover of claim 11 with the cover engaging the dielectric substrate comprising a means for impedance matching associated with the input and output metals on the other of the two major surfaces of the substrate to transform the impedance at the input and output metals adjacent the respective vias to substantially 50 ohms for testing and coupling to external circuitry.

14. A cover for a high-frequency circuit where the circuit has a substantially planar dielectric substrate, metal traces that are lithographically fabricated on one of two major surfaces of the substrate, an input and output port disposed on the substrate, one of the metal traces carrying a high-frequency signal between the input and output port, a plurality of other of the metal traces, connected to the one metal trace at intervals along the length of the one metal trace, each providing a reactance to the high-frequency signal where the reactance varies with frequency, additional traces of the metal traces serving as a reference ground for the one metal trace and the other metal traces;

the cover comprising:
a micro-machined silicon enclosure dimensioned to be mounted to the substrate with a first planar surface with cavities in the enclosure that extend through the first surface, internal walls within the silicon enclosure defining the cavities;
a layer of conductive metal covers the first planar surface, cavities and internal walls;
the silicon enclosure having substantially continuous areas of metal on the first planar surface about the periphery of the silicon enclosure dimensioned to engage corresponding areas of the additional traces about the periphery of the substrate with the silicon enclosure engaging the substrate;
with the enclosure engaging the dielectric substrate, each cavity surrounds at least one of the other metal traces with the internal cavity walls engaging the additional traces adjacent the respective other metal traces to individually surround the at least one of the other metal traces with a conductive metal thereby providing electromagnetic field isolation between cavities;
conductive engagement is formed between the first planar surfaces and the additional traces with the cover engaging the dielectric substrate to establish a common reference ground therebetween.

15. The cover of claim 14 wherein the substrate is silicon carbide and the metal is deposited gold.

16. The cover of claim 14 with the substrate having:
metal deposited on the other major surface of the substrate, and;
a plurality of closely spaced, contiguous, through-hole conductive vias disposed to connect the additional traces on the one surface of the substrate to the metal deposited on the other major surface of the substrate to define common reference ground.

17. The cover of claim 14 wherein the cavities are formed in a micromachined silicon wafer and the layer of conductive metal having a peak to valley roughness of less than 2 microns.

* * * * *